(12) United States Patent
Hwang et al.

(10) Patent No.: US 7,765,682 B2
(45) Date of Patent: Aug. 3, 2010

(54) APPARATUS FOR ATTACHING SUBSTRATES

(75) Inventors: Jae Seok Hwang, Seongnam-si (KR); Dong Gun Kim, Seongnam-si (KR)

(73) Assignee: ADP Engineering Co., Ltd., Seongnam-Si, Gyeongki-Do (KR)

( * ) Notice: Subject to any disclaimer, the term of this patent is extended or adjusted under 35 U.S.C. 154(b) by 0 days.

(21) Appl. No.: 11/866,892

(22) Filed: Oct. 3, 2007

(65) Prior Publication Data
US 2008/0124199 A1    May 29, 2008

(30) Foreign Application Priority Data

Nov. 29, 2006   (KR) .................. 10-2006-0118841
Dec. 8, 2006    (KR) .................. 10-2006-0125005

(51) Int. Cl.
*B23P 19/00*    (2006.01)
*H01L 21/10*    (2006.01)

(52) U.S. Cl. .................... 29/729; 29/743; 269/21; 349/187

(58) Field of Classification Search ............. 29/729, 29/739, 740, 743; 156/285, 312, 102–106; 349/187–190, 191, 192; 438/33
See application file for complete search history.

(56) References Cited

U.S. PATENT DOCUMENTS

| | | | | |
|---|---|---|---|---|
| 6,304,311 | B1 * | 10/2001 | Egami et al. ............ | 349/189 |
| 6,793,756 | B2 * | 9/2004 | Lee et al. ............ | 156/228 |
| 6,991,699 | B2 * | 1/2006 | Lee et al. ............ | 156/285 |
| 7,022,199 | B2 * | 4/2006 | Lee et al. ............ | 156/106 |
| 7,255,147 | B2 * | 8/2007 | Lee et al. ............ | 156/382 |
| 7,436,483 | B2 * | 10/2008 | Byun et al. ............ | 349/187 |
| 7,487,812 | B2 * | 2/2009 | Lee et al. ............ | 156/381 |
| 2001/0021000 | A1 * | 9/2001 | Egami ............ | 349/187 |
| 2002/0008838 | A1 * | 1/2002 | Matsuda ............ | 349/187 |

* cited by examiner

*Primary Examiner*—Minh Trinh
(74) *Attorney, Agent, or Firm*—KED & Associates LLP

(57) ABSTRACT

An apparatus for attaching substrates is provided with a buffering member between an upper chamber and a lower chamber. The buffering member reduces a load applied to a lifting device during vacuum exhaustion of a sealing space between the chambers. Therefore, it is possible to reduce a force applied to a lifting screw and a frame supporting a chamber, thereby extending the lifetime of the substrate attaching apparatus and component replacement. Also, it is possible to increase a lower chamber supporting force of a lifting part by coupling the lifting part to an external frame with a fixing device. As the result, the lower chamber is stably fixed and thus it is possible to reduce failures in a substrate attaching process.

20 Claims, 10 Drawing Sheets

APPARATUS FOR ATTACHING SUBSTRATES

This application claims the benefit, under 35 U.S.C. §119, of the filing date of Korean Patent Applications Nos. 10-2006-0118841 and 10-2006-0125005, which were filed on Nov. 29, 2006 and Dec. 8, 2006, respectively, the entire contents of which are incorporated herein by reference.

BACKGROUND

1. Field

The present disclosure relates to an apparatus for attaching two substrates to each other, and more particularly, to an apparatus for attaching substrates which is provided with a buffering member between an upper chamber and a lower chamber.

2. Background

Recently, with development of an information society, there have been increased requirements for display devices. Therefore many different types of display devices have been developed, such as a liquid crystal display (LCD), plasma display panel (PDP), etc. Users of these display devices require superior video quality, light weight as well as large size. Therefore, there has been recently developed a super large size LCD having a size of more than 50 inches.

An LCD display is a display device which displays information on its screen using anisotropy of a refractive index of a liquid crystal. The LCD display is manufactured by adding liquid crystals between two substrates and attaching the two substrates to each other. One of the two substrates is a driving device array substrate and the other is a color filter (CF) substrate. A plurality of pixels are formed on the driving device array substrate and each pixel is formed with a driving device such as a thin film transistor (TFT). A color filter layer for realizing color is formed on the color filter substrate, along with pixel electrodes, a common electrode and an alignment film for aligning liquid crystal molecules.

In a process of manufacturing such a display device, the process of attaching the two substrates to one another is very important. As the size of the display devices has increased, the size of the apparatus for attaching the two substrates has also increased.

The substrate attaching apparatus is designed to create a sealed attachment space. During the attachment process, this space is evacuated to create a vacuum. As the substrate attaching apparatus becomes larger, a load applied to the attaching apparatus due to a pressure difference between an inside and an outside of the attaching chamber has also increased. This load acts on the walls of the chamber body and can cause a deformation of the chamber. The deformation forces can also apply an excessive force to a lifting device for lifting one half of the chamber.

The lifting device of the attaching apparatus is provided with a lifting motor which provides a driving force for lifting the chamber. Lifting screws rotate axially to lift and lower a frame for supporting a portion of the chamber. Typically, the lifting device lifts a lower chamber until it is coupled with an upper chamber to seal the attachment space. The chamber is then vacuum exhausted. The vacuum state within the attachment space causes the lower chamber to be pulled up by a pressure difference. When the lower chamber is pulled up, forces are applied to the frame, the lifting screws, etc. which support the chamber. Therefore, the frame, the lifting screws, and other portions of the lifting apparatus may be deformed. This, in turn, tends to result in frequent replacement of parts and a short lifetime of the substrate attaching apparatus.

Also, during the attaching process, it is important to adjust a gap between the substrates so that the substrates have a uniform gap between them, and to also align the relative positions of the substrates so that both substrates are attached to each other at the exact desired positions. This gap adjustment process and the position alignment process can be accurately performed only after the lower chamber has been raised and fixed to the upper chamber.

Because, the attaching apparatus becomes larger with an enlargement of the substrate size, the weight of the lower chamber and the substrate placed within the lower chamber becomes heavier when the display size increases. Therefore, a load applied to the lifting part which lifts and supports the lower chamber also increases. The heavier loads of the larger attaching apparatus can cause the lifting screw to be elastically deformed. As a result, an error may occur in the gap adjustment process or the position alignment process.

BRIEF DESCRIPTION OF THE DRAWINGS

The embodiments will be described in detail with reference to the following drawings, in which like reference numerals refer to like elements, and wherein.

DETAILED DESCRIPTION

Certain embodiments of the present invention will be described in greater detail with reference to the accompanying drawings.

Figure 1:
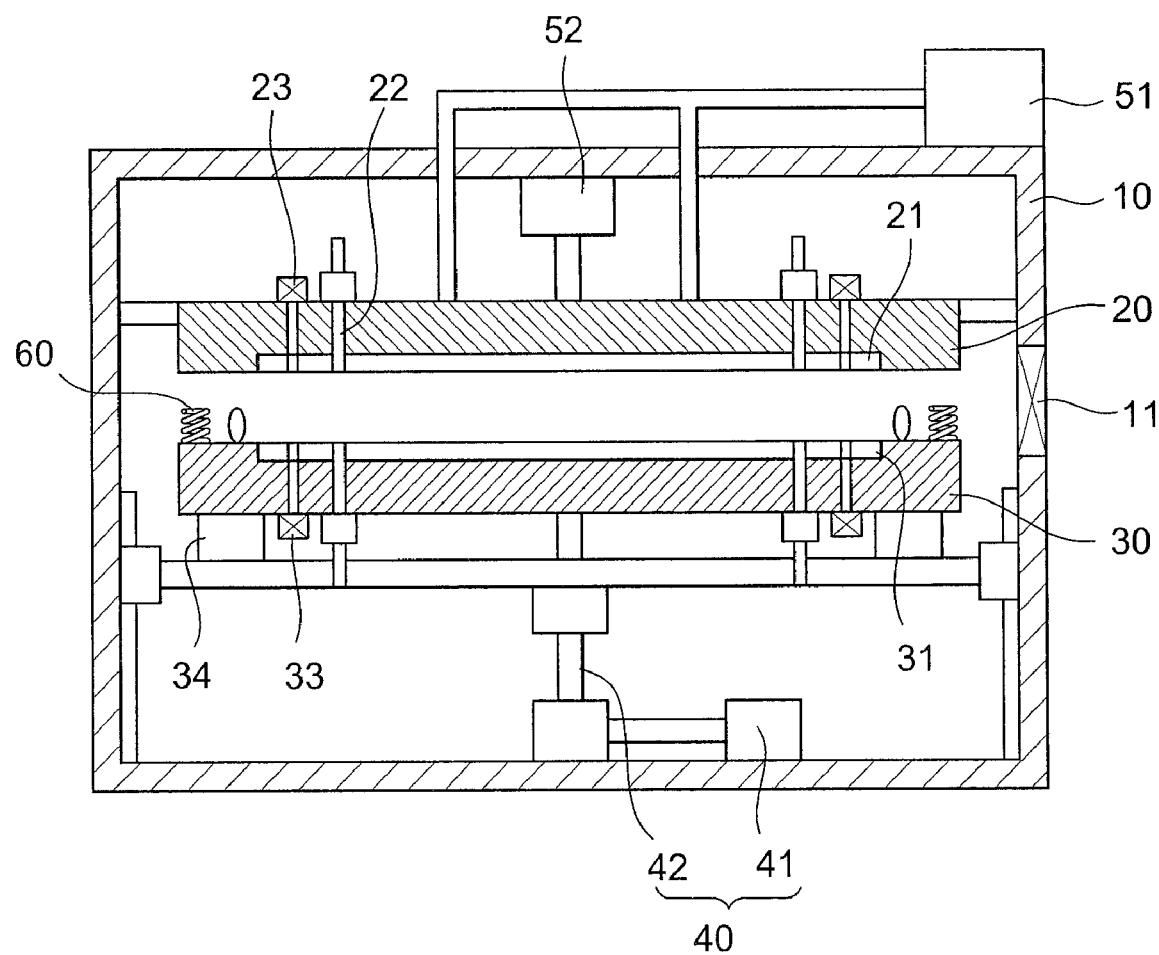
FIG. 1 is a sectional view illustrating a first embodiment of an apparatus for attaching substrates.

FIG. 1 is a sectional view illustrating a first embodiment of an apparatus for attaching substrates. Referring to FIG. 1, the apparatus is provided with an external frame 10. An upper chamber 20 and a lower chamber 30 form a substrate attaching space. A lifting part 40 provides a lifting force to move the lower chamber 30 upward into engagement with the upper chamber 20. A buffering member 60 is placed between the upper chamber 20 and the lower chamber 30.

The external frame 10 is provided with a door 11 for inserting and removing the substrates. Preferably, the door 11 is opened only when the substrates are inserted and removed so that foreign substances such as dust do not enter into an inside of the substrate attaching apparatus. The insertion and removal of the substrates is performed by a transportation robot (not shown). The transportation robot is provided with one or more robot arms for transferring an upper substrate S1 and lower substrate S2 into and out of the apparatus.

A first vacuum pump 51 evacuates the space between the upper and lower chambers to create a vacuum in an attachment space formed between the upper and lower chambers. A second vacuum pump 52 generates a vacuum absorbing force that is applied to substrate receiving pins 22 which receive and hold the upper substrate S1 and the lower substrate S2. The two vacuum pumps can be located inside or outside of the external frame 10.

The first vacuum pump 51 is typically provided outside of the external frame 10, and is connected to an attaching space formed between the upper chamber 20 and the lower chamber 30 through a vacuum pipe. The second vacuum pump 52 is fixed to the external frame 10 and is connected to the substrate receiving pins 22 of the upper chamber 20 and the lower chamber 30 through vacuum pipes. The vacuum pumps may include a dry pump, a turbomolecular pump (TMP), a mechanical boost pump, etc. Preferably, the vacuum pump is a rotary vane pump which is capable of discharging vacuum-pumped substances.

Although this embodiment uses a vacuum generated by a vacuum pump and receiving pins to hold the substrates, other embodiments could utilize other holding devices. For instance, the holding devices could be electrostatic chucks or other types of devices.

The upper chamber 20 is fixed to the external frame 10 and the lower chamber 30 is lifted up and down by the lifting part 40. The lower chamber 30 is lifted up to be coupled to the upper chamber 20, to form the sealed attaching space.

The upper chamber 20 is fixedly attached to a support, which is itself fixed to an inner wall of the external frame 10. The upper chamber 20 is provided with an upper chuck 21 for holding the upper substrate S1. As noted above, the upper chuck 21 may be an electrostatic chuck (ESC) which holds the upper substrate S1 with an electrostatic force, and/or a vacuum chuck. The upper chuck 21 may be recessed into the upper chamber 20 to form an integral chamber structure. The upper chamber 20 may also include substrate receiving pins 22 for receiving the upper substrate S1, and one or more cameras 23 for aligning the upper substrate S1 and the lower substrate S2.

Substrate receiving pins 22 are also provided in the lower chamber 30 in order to receive and hold the lower substrate S2. Typically the substrate receiving pins 22 are capable of being recessed into the top surface of the lower chamber.

One or more cameras 23, which are provided at the upper part of the upper chamber 20, detect alignment marks on the upper substrate S1 and the lower substrate S2 through photographing holes which pass through the upper chamber 20. The images generated by the cameras are used to confirm whether the substrates are properly aligned with each other. One or more illuminating devices 33 are provided at the lower part of the lower chamber 30 to provide light through illuminating holes which pass through the lower chamber 30 so that the cameras 23 can detect the alignment marks.

The lower chamber 30 is provided at an upper end of a horizontal frame which is connected to the lifting part 40. The lower chamber 30 is provided with a lower chuck 31 for holding the lower substrate S2. The lower chuck 31 may be an electrostatic chuck (ESC) which holds the lower substrate S2 with an electrostatic force, and/or a vacuum based chuck. The lower chuck 31 is recessed into the lower chamber 30 to form an integral chamber structure.

The lifting part 40 includes a lifting motor 41 for providing a lifting/lowering force and a lifting screw 42. Preferably, the lifting motor 41 is a motor which can generate a force capable of supporting the load of the lower chamber 30 and of lifting up and down the lower chamber 30. The motor may include an AC motor, a DC motor and the like. The high speed rotational force of the lifting motor 41 is converted to a low speed rotational force by a reducer, which causes the lifting screw 42 to rotate at a low speed and to lift up and down the lower chamber 30 in a suitable speed.

The lifting screw 42 supports and moves a horizontal frame that supports the lower chamber 30. Both ends of the horizontal frame are connected to guide shafts to balance the lower chamber 30, and to ensure a smooth lifting of the lower chamber 30.

Once the substrates are mounted on the upper and lower chambers, the lower chamber 30 is lifted up by the lifting part 40 and is coupled to the upper chamber 20 to form the sealed attachment space. The sealed attachment space can then be vacuum-exhausted by the first vacuum pump 51 to form a vacuum.

An alignment means for moving the lower chamber 30 is provided between the lower chamber 30 and the horizontal frame. Preferably, the alignment means 34 can move the lower chamber 30 in X, Y and rotational directions. Generally, a plurality of cams are used as the alignment means 34. An upper side of the cam abuts a lower end of the lower chamber 30 and a lower side of the cam is fixed to the horizontal frame. The upper side of the cam abutting to the lower chamber 30 moves the lower chamber 30 with a rotational force provided by a driving motor. The movement of the lower chamber in X, Y and rotational directions, relative to the upper chamber, makes it possible to properly align the upper and lower substrates with respect to each other.

Although not shown in the drawings, the attaching apparatus may also include a pressurizing means for pushing the substrates against each other. A mechanical device can be used to push on the substrates directly, or the pressure may be applied using a gas pressure. If gas pressure is used the pressurizing means may include a gas tank and a gas supplying pipe for supplying inert gas such as nitrogen gas, and a gas pressurizing hole for discharging the gas into the attaching space.

The buffering member 60 is provided at a periphery of the lower chamber 30. It acts to elastically support between the upper chamber 20 and the lower chamber 30 when the attaching space formed by the coupling between the upper chamber 20 with respect to the lower chamber 30 is vacuum-exhausted. Alternatively, the buffering member 60 may be provided at a periphery of the upper chamber 20.

In this embodiment, the buffering member 60 includes a compression coil spring. In alternate embodiments, the buffering member could be a leaf spring, an air spring and other similar elastic elements. The buffering member 60 will be described in more detail with reference to FIG. 2.

Figure 2:
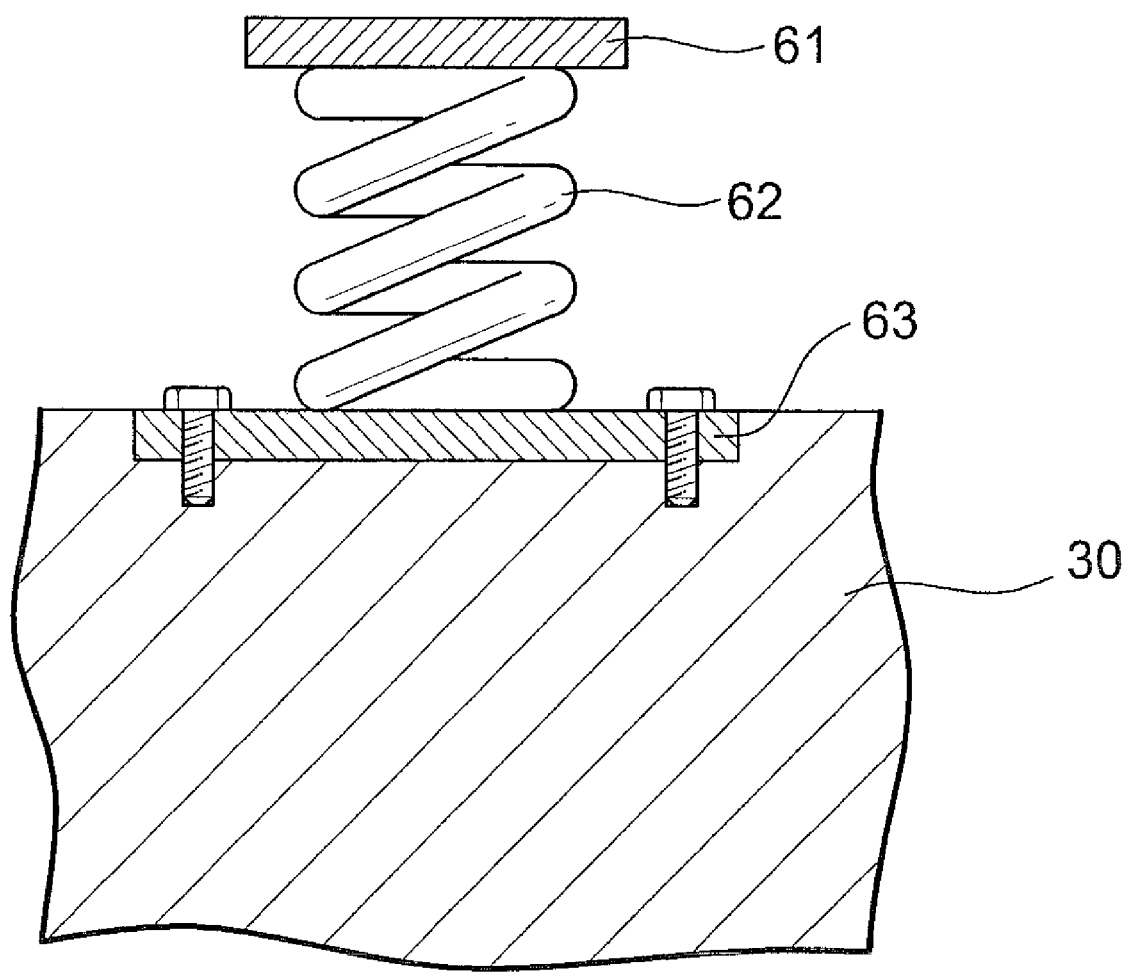
FIG. 2 illustrates a buffering member for buffering between an upper chamber and a lower chamber of the apparatus shown in FIG. 1.

Referring to FIG. 2, the buffering member 60 is provided with an elastic body 62 having a predetermined elastic force. An upper frame 61 is provided at an end of the elastic body 62 so that it can contact a lower end of the upper chamber 20. A lower frame 63 provided at the other end of the elastic body 62 and is contacted with an upper end of the lower chamber 30.

As shown in the drawing, in this embodiment the buffering member 60 is mounted at the periphery of the lower chamber 30. The lower frame 63 of the buffering member 60 is fixed to the lower chamber 30. The upper frame 61 abuts a lower side of the upper chamber 20 when the upper and lower chambers are brought together. Preferably, a plurality of buffering members 60 are provided around the periphery of the lower chamber 30 so as to provide a uniform support force between the upper chamber 20 and the lower chamber 30.

When the attaching space formed between the upper chamber 20 and the lower chamber 30 is vacuum-exhausted, and thus the lower chamber 30 is pulled up by the force of the vacuum, the elastic body 62 is deformed. The deformation of the elastic body helps to disperse the force created by the vacuum, and thus reduces deformation of the upper and lower chambers. The elastic body 62 may be made of a metallic material such as heat treated steel, phosphor bronze, nickel alloy, etc.

The compression coil spring shown in FIG. 2 is made of a metallic material such as round bar, square steel and the like, and is helically wound. In alternate embodiments, a leaf spring having a number of flat plates made of spring steel can be stacked to form the elastic body. In still other embodiments, an air spring comprising a bellows-like vessel, in which air is injected, can be used as the elastic body.

Figure 3A:
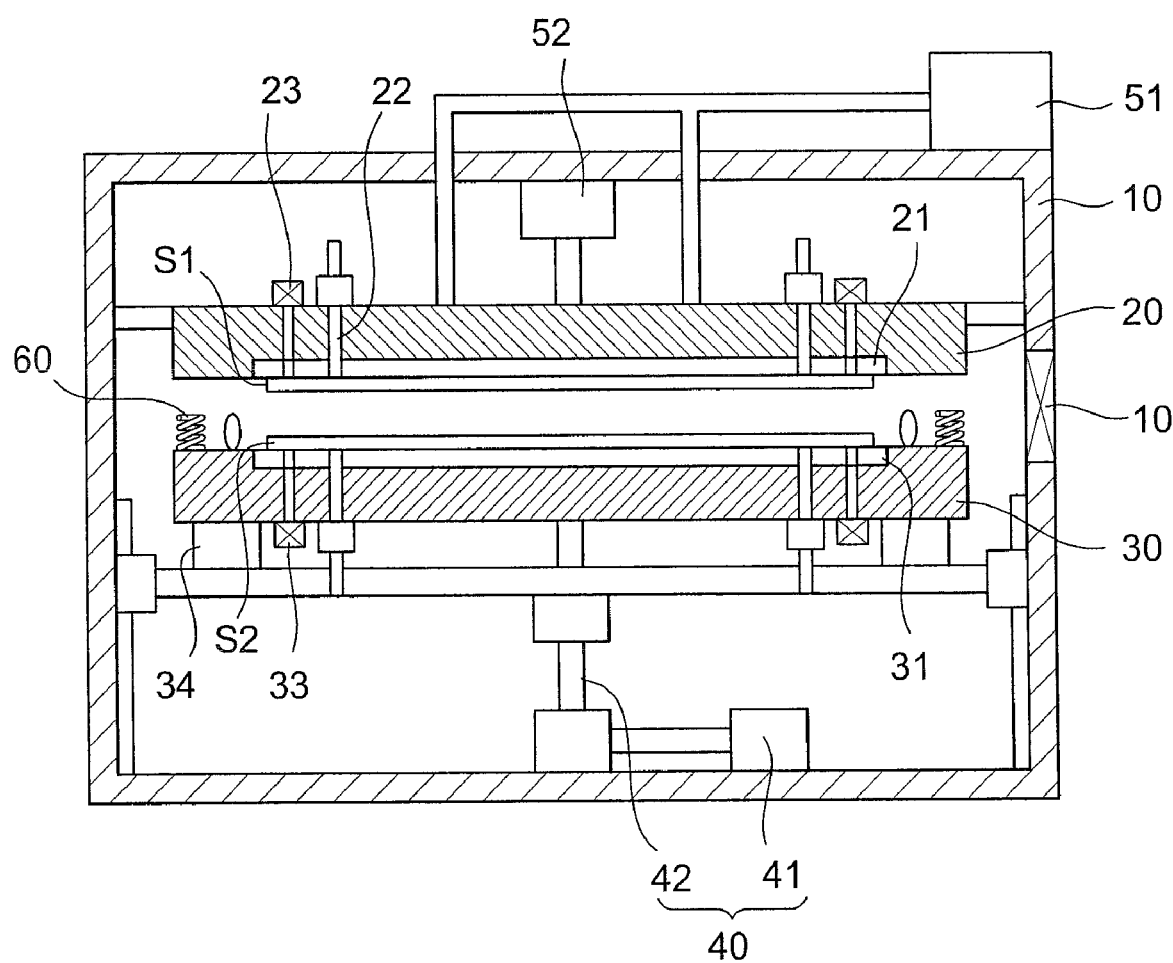
FIGS. 3A to 3C are views that illustrate how the lower chamber is raised during an attachment process.
Figure 3B:
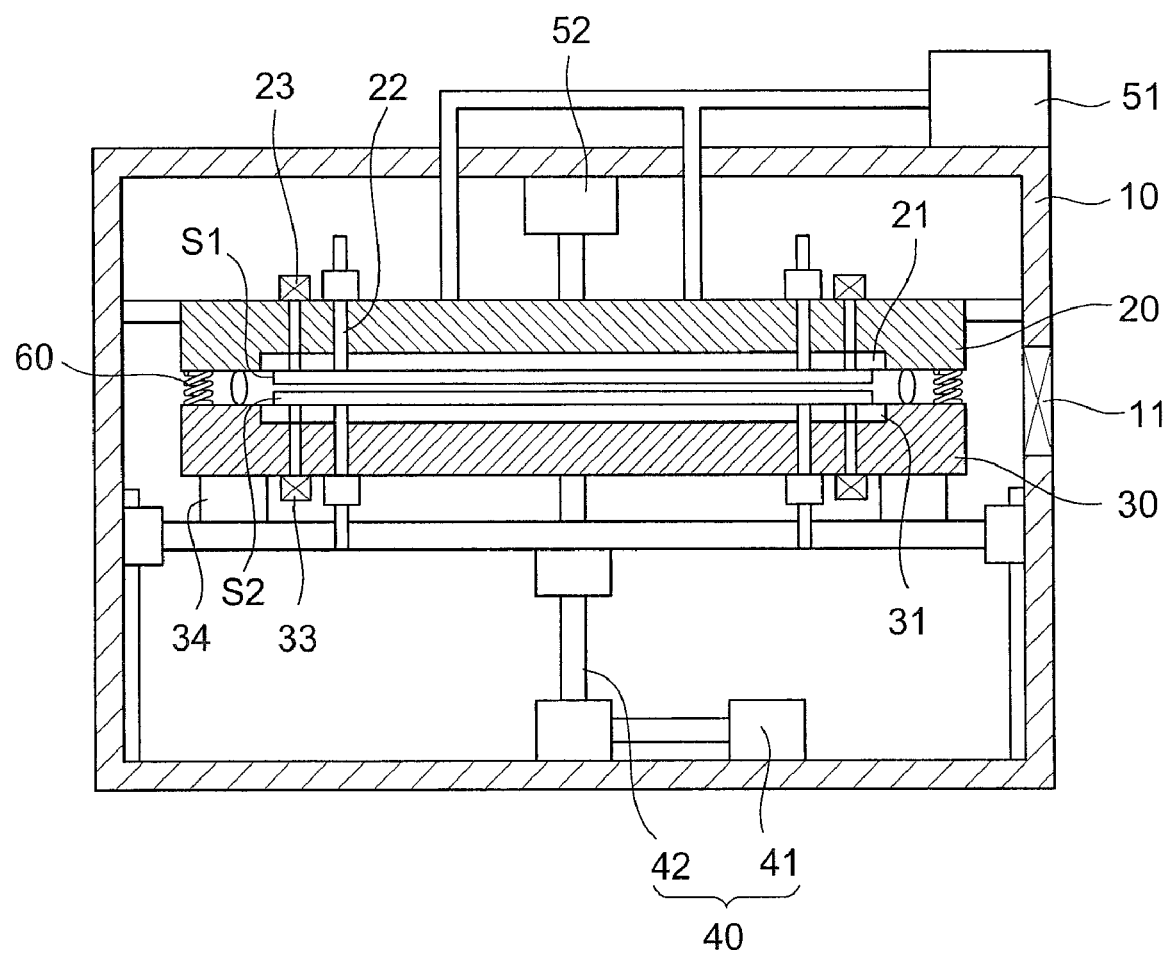
Figure 3C:
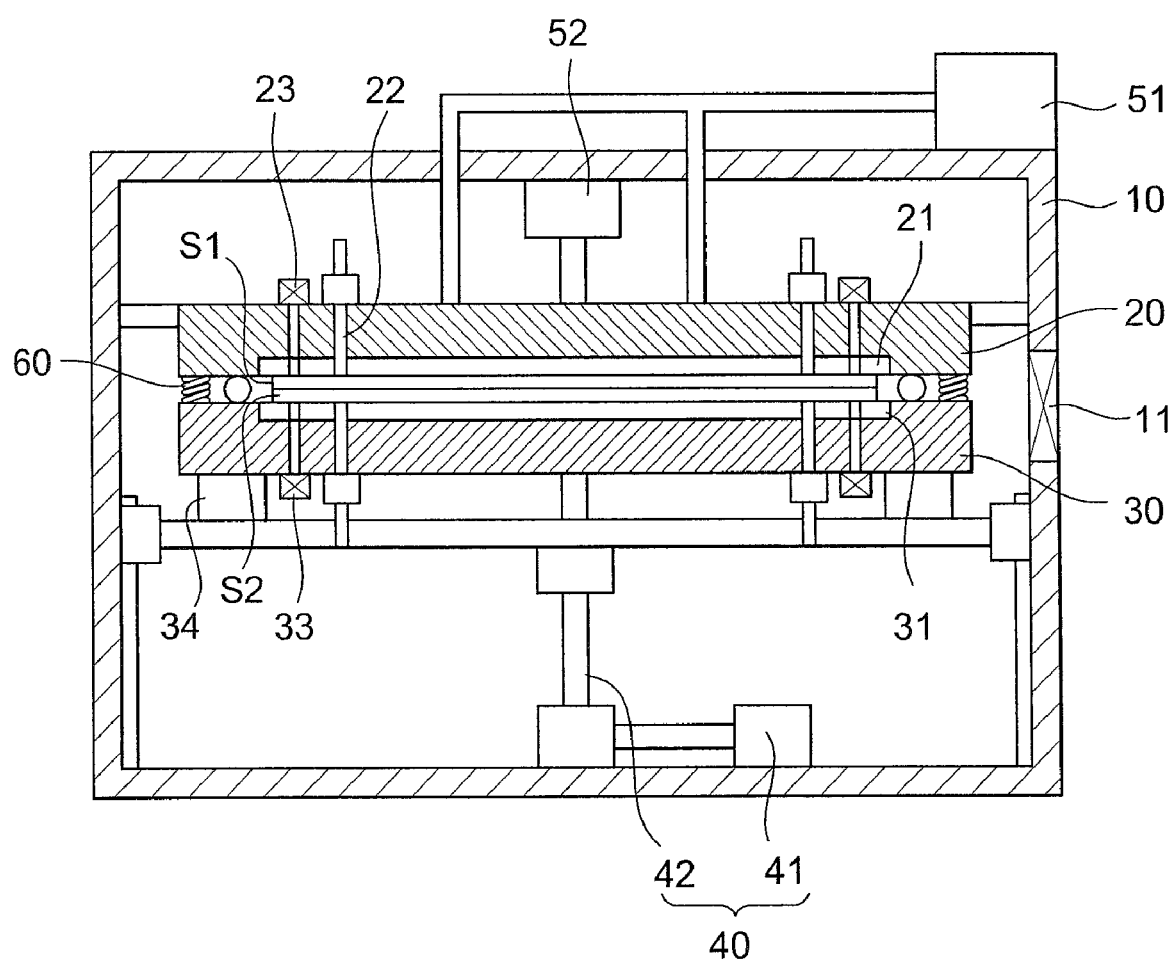

FIGS. 3A to 3C illustrate steps in a process performed by the apparatus for attaching substrates. FIG. 3A shows that the upper substrate S1 and the lower substrate S2 have been mounted on the upper and lower chambers. FIG. 3B shows that the lower chamber 30 has been lifted up to form the sealed attaching space. FIG. 3C shows the apparatus after the attaching space has been vacuum-exhausted and thus the upper substrate S1 and the lower substrate S2 are attached to each other.

Referring to FIGS. 3A to 3C, at the beginning of the process, in order to insert the substrates into the attaching apparatus, the lower chamber 30 is moved down so that it is apart from the upper chamber 20 at the maximum distance, and the door 11 of the external frame 10 is opened. Through the opened door 11, the transportation robot carries the upper substrate S1 into the inside of the attaching apparatus. The upper substrate S1 is held by the robot arm. After the upper substrate S1 is carried in, the substrate receiving pins 22 of the upper chamber 20 vacuum-absorb the upper substrate S1 to hold the upper substrate S1. Then, the substrate receiving pins 22 which are holding the upper substrate S1 are lifted up to seat the upper substrate S1 onto the upper chamber 20. At this time, the upper chuck 21 of the upper chamber 20 would exert a holding force on the upper substrate S1.

Once the upper substrate S1 is held by the upper chamber 20, and the robot arm of the transportation robot goes out of the attaching apparatus, and the transportation robot carries the lower substrate S2 into the inside of the attaching apparatus. The lower substrate S2 is held by the robot arm. The substrate receiving pins 22 of the lower chamber 30 are lifted up to receive the lower substrate S2, and the robot arm of the transportation robot goes out of the substrates attaching apparatus. Then, the substrate receiving pins 22 are moved down to seat the lower substrate S2 onto the lower chamber 30. At this time, a lower chuck 31 of the lower chamber 30 would exert a holding force on the lower substrate S2, and the door 11 of the external frame 10 is closed.

After that, the lower chamber 30 is lifted up by the lifting part 40 and is coupled to the upper chamber 20 to form the sealed attaching space. When the upper chamber 20 and the lower chamber 30 are coupled, the buffer member 60 buffers an impact between the upper chamber 20 and the lower chamber 30, and thus reduces any jolt on the upper substrate S1 and the lower substrate S2 which might be caused when the upper and lower chambers come together. At this time, the upper substrate S1 and the lower substrate S2 are adjacent to each other, as shown in FIG. 3B.

Subsequently, as shown in FIG. 3C, the first vacuum pump 51 discharges air from the attaching space to the outside to keep the attaching space in a vacuum state. At this time, the buffering member 60 provides an elastic force between the upper chamber 20 and the lower chamber 30 which opposes a force which is applied to the lower chamber 30 due to the vacuum state. Therefore, it is possible to prevent the lifting part 40 from being subjected to an excessive force in upward direction due to the forces caused by the vacuum state.

The cameras 23 then detect the alignment marks of the upper substrate S1 and the lower substrate S2 to confirm an alignment state of the substrates. If the alignment state of the substrates is poor, the alignment means 34 moves the lower chamber 30 so that the upper substrate S1 and the lower substrate S2 are properly aligned.

Once the alignment state of the substrates is good, the electrostatic force of the upper chuck 21, which holds the upper substrate S1, is removed and thus the upper substrate S1 falls down onto the lower substrate S2. At this time, the upper substrate S1 and the lower substrate S2 are preliminarily attached by a sealant. Subsequently, the substrates may be pushed together by the pressurizing means, and thus the upper substrate S1 and the lower substrate S2 may be more firmly attached to one another. In some embodiments, gas is introduced into the attaching space and the upper substrate S1 and the lower substrate S2 are pushed together by a pressure difference between the gas introduced into the attachment space and a vacuum state which exists in a space between the upper and lower substrates.

The lower chamber 30 is then moved down so that it separates upper chamber 20. At this time, the buffering member 60 allows the upper chamber 20 and the lower chamber 30 to be separated with less power. Subsequently, the door 11 of the external frame 10 is opened and the transportation robot grasps the attached substrates and removes them from the chamber.

Although the embodiment described above has a lower chamber 30 that is lifted up and down by the lifting part 40, in alternate embodiments the upper chamber 20 may be moved up and down by the lifting part 40, or both the upper chamber 20 and the lower chamber 30 may be moved up and down.

Figure 4:
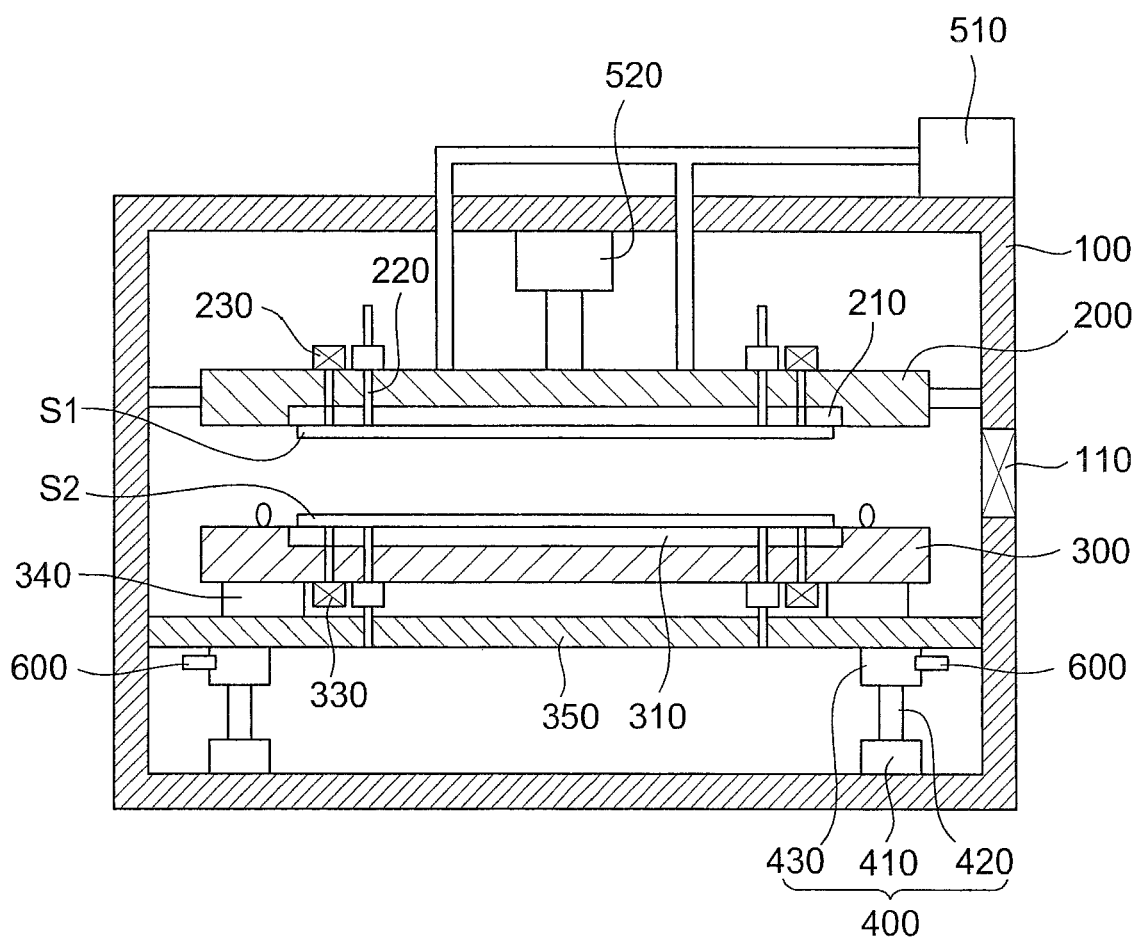
FIG. 4 is a sectional view illustrating another embodiment of an apparatus for attaching substrates.

FIG. 4 is a sectional view illustrating another embodiment of an apparatus for attaching substrates. This embodiment is very similar to the embodiment described above. Accordingly, a description of the same elements will not be provided.

Referring to FIG. 4, in this embodiment, multiple lifting devices 400 provides a lifting force and a supporting force to the lower chamber 300. This embodiment also includes a plurality of fixing devices 600 which are coupled to the lifting devices 400. The fixing devices can be selectively coupled to the frame 100 using a magnetic force to increase a lower chamber supporting force of the lifting devices 400.

The lifting devices 400 may include a lifting motor 410, a lifting screw 420 and a lifting table 430. The lifting screw 420 is a medium which transfers a driving force of the lifting motor to the lifting table 430, and the lifting table 430 is coupled to the lifting screw 420 and is in contact with the horizontal frame 350.

The fixing devices 600 may be combined with the lifting devices 400, and may be coupled to the lifting table 430 of the lifting devices 400. Also, the fixing devices 600 may be integrally formed with the lifting table 430. The fixing devices 600 are attached to the external frame using a magnetic force after the lower chamber 300 has been lifted up to form the substrate attaching space, and after a position of the lower chamber 300 has been adjusted to properly align the substrates.

Figure 5A:
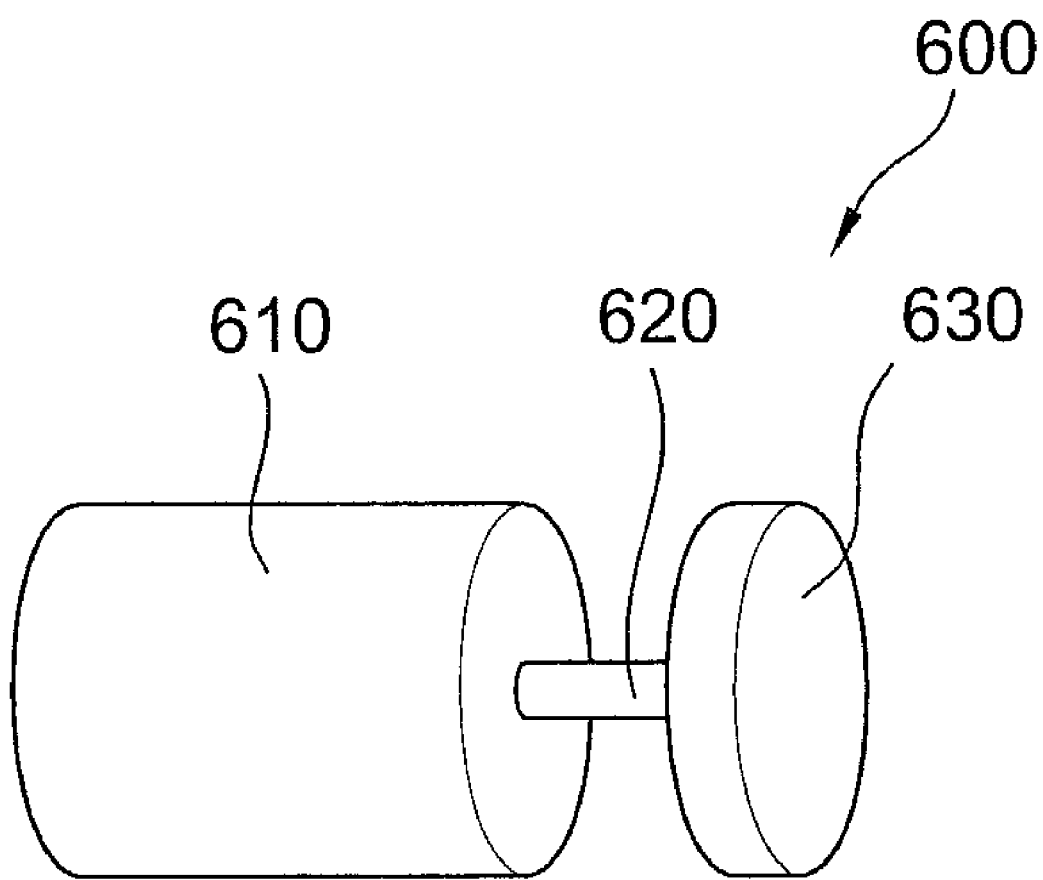
FIG. 5A illustrates a fixing device.
Figure 5B:
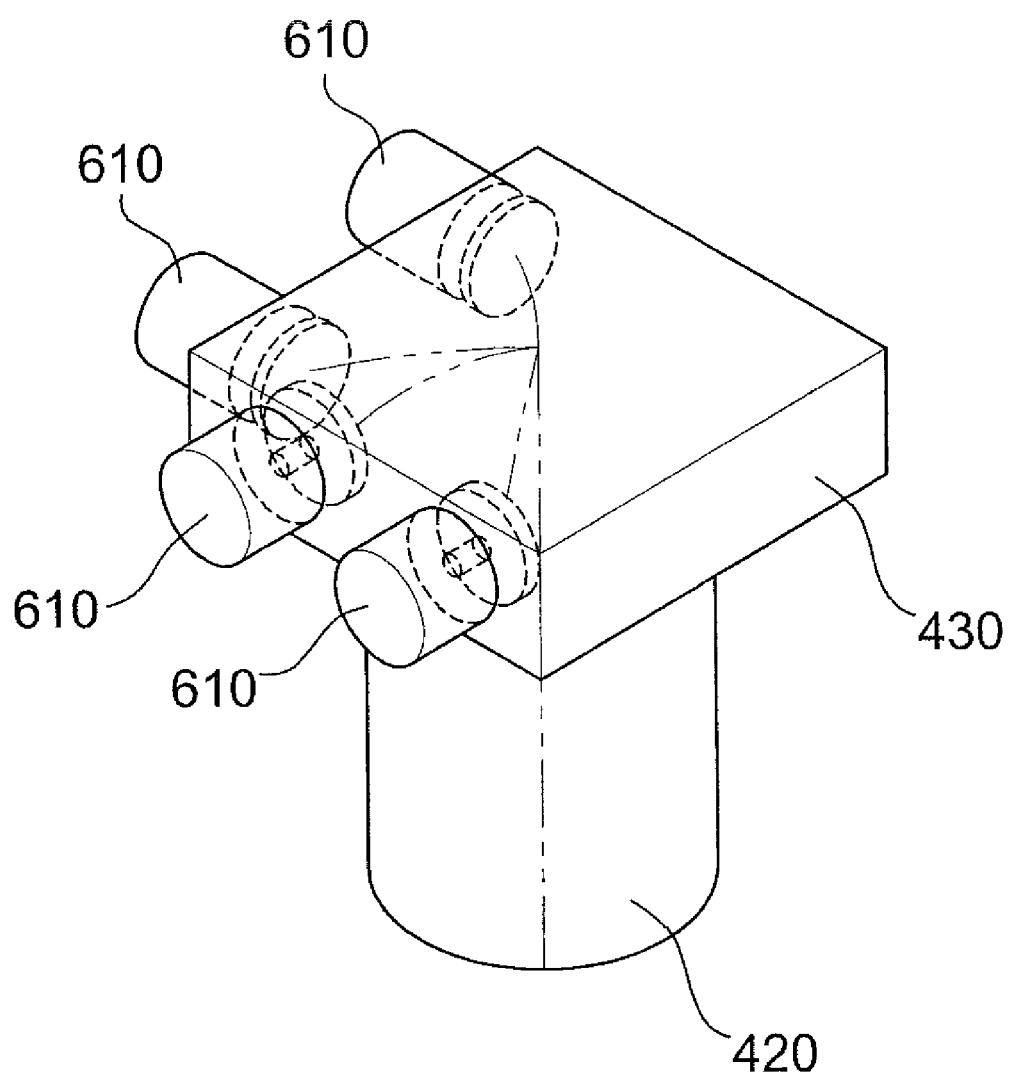
FIG. 5B illustrates how the fixing device is installed in a lifting table of a lifting part.
Figure 5C:
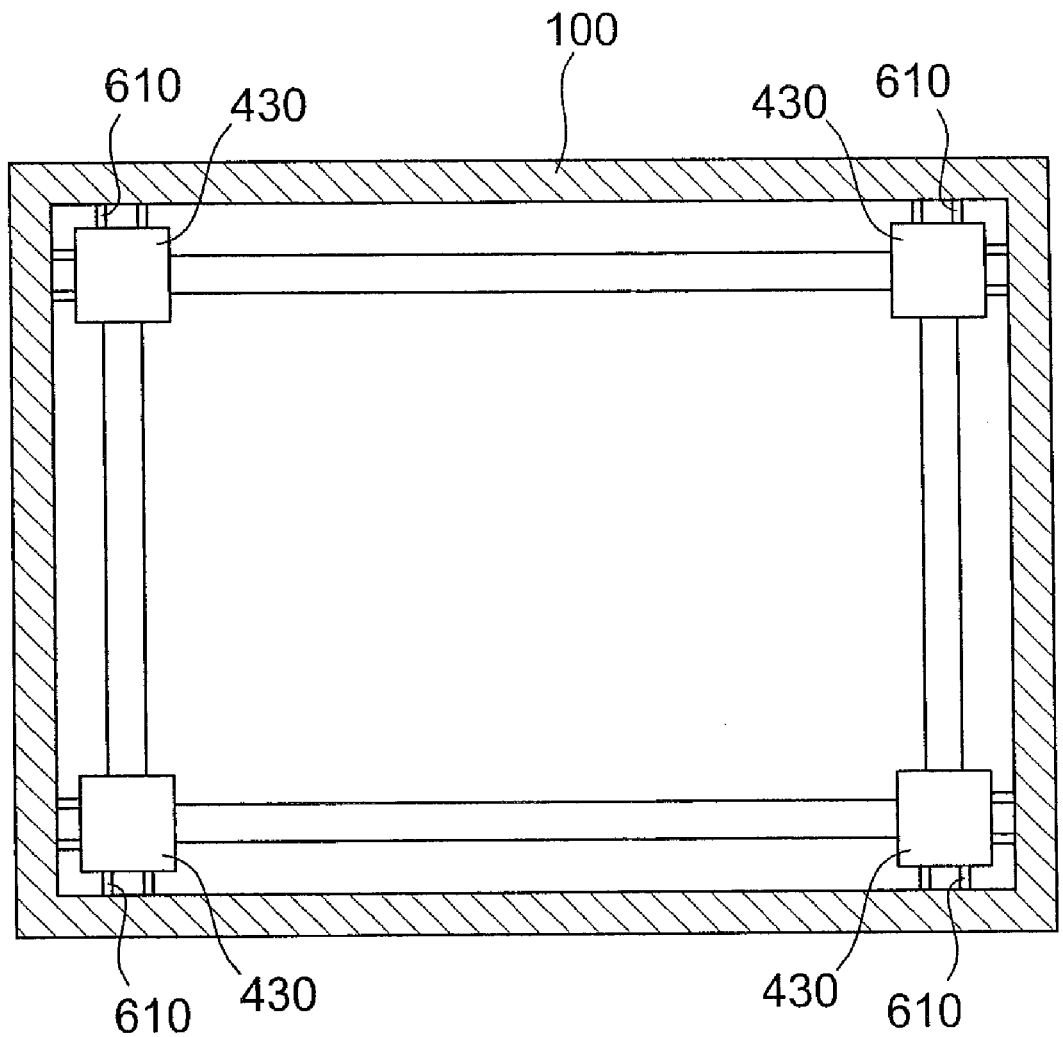
FIG. 5C is a plan view illustrating how a magnetic part of the fixing device is attached to an external frame.

FIG. 5A illustrates a construction of one embodiment of a fixing device 600. FIG. 5B illustrates how the fixing devices can be installed on the lifting table of the lifting part. FIG. 5C is a plan view illustrating magnetic parts of the fixing devices attached to the external frame.

Referring to FIGS. 5A to 5C, the fixing device 600 includes a magnetic part 610, which is attachable to the external frame 100 using magnetic force. A moving means 620 moves the magnetic part 610. Also, the fixing device 600 may further include an electricity supplying part 630 for supplying electricity to the magnetic part 610 (see FIG. 5A). This fixing device 600 may be installed in the lifting table 430 of the lifting part 400, as shown in FIG. 5B.

The magnetic part 610 is selectively attached to the external frame 100 using a magnetic force. In this case, the magnetic part 610 may be a permanent magnet which always exerts a magnetic force. However, preferably, the magnetic part 610 is an electromagnet in which production of the magnetic force depends on the application of electric power.

The magnetic part 610 is attached to the external frame 100 to fix the movable portion of the lifting device 400 to the external frame 100. As a result, the lower chamber supporting force of the lifting part 400 is increased. Multiple fixing devices 600 having multiple magnetic parts 610 can be used on a single lifting table 430. When a plurality of magnetic parts 610 are installed, they may be attached to two or more adjoining positions of the external frame 100 (see FIG. 5C).

The moving means 620 serves to move the magnetic part 610 into engagement with the frame. The moving means 620 is coupled to the magnetic part 610 and moves the magnetic part 610 toward the external frame 100, and possibly also in the reverse direction. The moving means 620 may include a linear motor.

Alternatively, the moving means 620 may be a spring. When the moving means 620 is a spring, the moving means 620 serves only to pull the magnetic part 610 in a direction away from the external frame 100. When current is supplied to the magnetic part 610, the magnetic part 610 will automatically attach itself to the external frame 100 due to a magnetic force which is stronger than a force of the spring. When the current to the magnetic part 610 is cut off, the magnetic force is removed and the magnetic part 610 returns automatically to the lifting table 430 under the urging of the spring. Therefore, it may be possible to construct the moving means 610 at a low cost using a spring.

The moving means 620 separates the magnetic part 610 from the external frame 100 to prevent the magnetic part 610 from being worn away due to friction with the external frame 100 when the lower chamber needs to move.

The electricity supplying part 630 serves to supply electricity to the magnetic part 610. If the magnetic part 610 is an electromagnet, a magnetic force is only generated when current is applied to the electromagnet. The more the current flows, the stronger the magnetic force of the electromagnet becomes.

Figure 6:
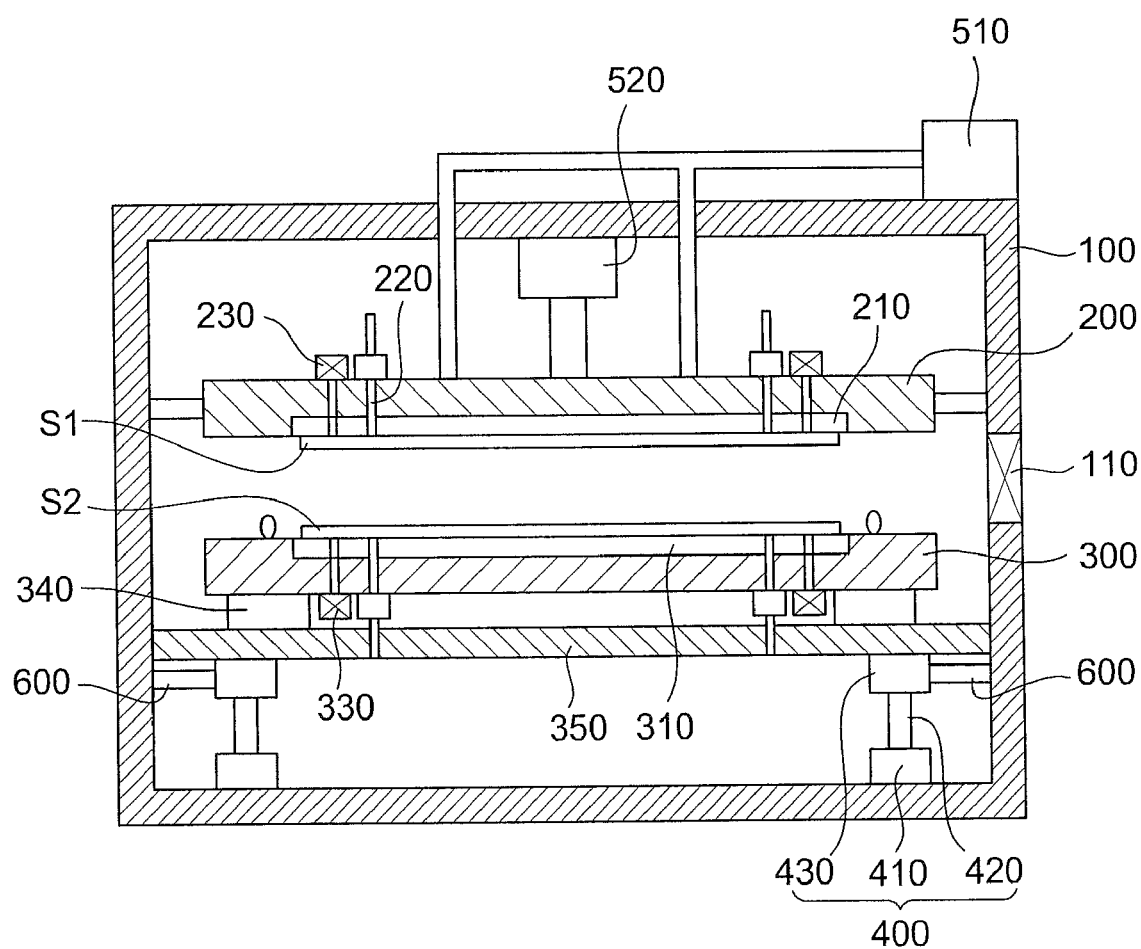
FIG. 6 illustrates how the magnetic part of the apparatus for attaching substrates in accordance with another embodiment of the present invention is attached to the external frame by using magnetic force.

Hereinafter, a description will be made of an operation of the substrate attaching apparatus provided with fixing devices 600. FIG. 6 shows an embodiment where the magnetic parts of multiple fixing devices are attached to the external frame 100 using a magnetic force.

When a substrate attaching apparatus is loaded with substrates and the lower chamber is lifted into engagement with the upper chamber, then alignment of the substrates is performed. When the alignment process is finished, the magnetic parts 610 of the fixing devices 600 are extended out of the lifting table 430 using the moving means 620 so that they contact the external frame 100. If the magnetic parts 610 are closely contacted with the external frame 100, electricity is supplied to the magnetic parts 610 by the electricity supplying parts 630 so that the magnetic parts 610 are securely coupled to the external frame 100 by the magnetic attractive force. Since the external frame 100 is a rigid body, the lower chamber supporting force is increased by the coupling of the lifting tables to the external frame 100, as shown in FIG. 6. Thereafter, the first vacuum pump 510 discharges air in the attaching space to create a vacuum state. In some embodiments, the process of making the attaching space into a vacuum state may be performed before the alignment process is performed. Thus, in some embodiments, the fixing devices may be engaged with the external frame before the alignment process is performed.

In an apparatus for attaching substrates as described above, because a buffering member is provided between the upper chamber and the lower chamber, a load applied to the lifting device upon vacuum-exhaustion of the attachment space is reduced. Thus, it is possible to reduce a force applied to the lifting screw and the frame supporting the chamber, thereby extending the lifetime of the attaching apparatus and reducing a trouble of frequent component replacement.

Also, it is possible to increase the lower chamber supporting force of the lifting part by coupling the lifting part to the external frame with one or more fixing devices. As a result, the lower chamber is stably fixed and thus it is possible to reduce defects in the substrates attaching process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, various variations and modifications are possible in the component parts and/or arrangements which would fall within the scope of the disclosure, the drawings and the appended claims. In addition to variations and modifications in the component parts and/or arrangements, alternative uses will also be apparent to those skilled in the art.

What is claimed is:

1. An apparatus for attaching substrates, the apparatus comprising:
   a main frame;
   an upper chamber mounted on the main frame that holds an upper substrate;
   a lower chamber mounted on the main frame that holds a lower substrate;
   at least one moving device that moves at least one of the upper chamber or lower chamber so that the upper and lower chambers are brought together to form a sealed attaching space therebetween;
   a vacuum pump that evacuates the sealed attaching space; and
   at least one fixing device that is attached to a moving portion of the at least one moving device, wherein the at least one fixing device selectively couples the moving portion of the moving device to the main frame, wherein the at least one moving device comprises:
   a lifting screw that is coupled to a lifting motor; and
   a lifting table coupled to the lifting screw and in contact with the at least one of the upper chamber or lower chamber, the lifting table transferring a lifting force of the lifting motor to the at least one of the upper chamber or lower chamber through the lifting screw.

2. The apparatus of claim 1, wherein the at least one fixing device comprises a magnetic part that is selectively coupled to the main frame by a magnetic force.

3. The apparatus of claim 2, wherein the magnetic part comprises an electromagnet.

4. The apparatus of claim 3, wherein the at least one fixing device further comprises an electric power supplying part that selectively applies electric power to the electromagnet.

5. The apparatus of claim 2, wherein the at least one fixing device further comprises a moving part that selectively moves the magnetic part into or out of engagement with the main frame.

6. The apparatus of claim 5, wherein the moving part comprises a spring that provides an elastic force that pulls the magnetic part out of engagement with the main frame.

7. The apparatus of claim 1, wherein the at least one fixing device is attached to the lifting table.

8. The apparatus of claim 7, wherein the at least one fixing device is attached to at least one side surface of the lifting table.

9. The apparatus of claim 8, wherein the at least one fixing device comprises at least two fixing devices attached, respectively, to at least two side surfaces of the lifting table.

10. The apparatus of claim 8, wherein the at least one fixing device is attached to the lifting table such that the magnetic part is selectively coupled to two adjoining positions on the main frame.

11. The apparatus of claim 7, wherein the at least one fixing device comprises a magnetic part that is selectively coupled to the main frame by a magnetic force.

12. The apparatus of claim 11, wherein the magnetic part comprises an electromagnet.

13. The apparatus of claim 12, wherein the at least one fixing device further comprises an electric power supplying part that selectively applies electric power to the electromagnet.

14. The apparatus of claim 11, wherein the at least one fixing device further comprises a moving part that selectively moves the magnetic part into or out of engagement with the main frame.

15. The apparatus of claim 14, wherein the moving part comprises a spring that provides an elastic force that pulls the magnetic part out of engagement with the main frame.

16. The apparatus of claim 1, wherein the at least one moving device comprises a plurality of moving devices, and wherein at least one fixing device is attached to a moving portion of each of the plurality of moving devices.

17. The apparatus of claim 16, wherein a plurality of fixing devices is attached to the moving portion of each of the plurality of moving devices.

18. The apparatus of claim 17, wherein each of the plurality of moving devices comprises:
 a lifting screw that is coupled to a lifting motor; and
 a lifting table coupled to the lifting screw and in contact with the at least one of the upper chamber or lower chamber, the lifting table transferring a lifting force of the lifting motor to the at least one of the upper chamber or lower chamber through the lifting screw.

19. The apparatus of claim 1, wherein the at least one fixing device selectively couples the moving portion of the moving device to a vertically extending inner side wall of the main frame.

20. The apparatus of claim 19, wherein the plurality of moving devices comprise a moving device provided at each of four corners of the at least one of the upper chamber or lower chamber.

* * * * *